(12) United States Patent
Garcia et al.

(10) Patent No.: US 7,173,432 B2
(45) Date of Patent: Feb. 6, 2007

(54) METHOD AND MACHINE FOR REPETITIVE TESTING OF AN ELECTRICAL COMPONENT

(75) Inventors: Douglas John Garcia, Beaverton, OR (US); Kyung Young Kim, Portland, OR (US); Locke Lowman, San Marcos, CA (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 11/284,789

(22) Filed: Nov. 21, 2005

(65) Prior Publication Data

US 2006/0232279 A1    Oct. 19, 2006

Related U.S. Application Data

(60) Provisional application No. 60/360,261, filed on Nov. 22, 2004.

(51) Int. Cl.
*G01R 31/12* (2006.01)
*G01R 31/02* (2006.01)

(52) U.S. Cl. ................................. 324/548; 324/537
(58) Field of Classification Search ............ 324/548
See application file for complete search history.

(56) References Cited

U.S. PATENT DOCUMENTS 5,842,579 A    12/1998  Garcia et al.

6,043,101 A    3/2000  Stubblefield et al.

OTHER PUBLICATIONS

"The Capacitor," general information. No publication date.
ESI 3340 Enhanced Productivity MLCC Multi-Function Tester, Oct. 2003.
"Improve Your Designs with Large Capacitance Value Multi-Layer Ceramic Chip (MLCC) Capacitors", Panasonic Industrial Company, Jul. 3, 2003.
"QuadTech" Application Notes, QuadTech Incorporated, Feb. 2002.
ESI Passive Components, http://www.esi.com/products/pd_ecs. asp, viewed Nov. 20, 2004. (Best available copy).

*Primary Examiner*—Andrew H. Hirshfeld
*Assistant Examiner*—Jeff Natalini
(74) *Attorney, Agent, or Firm*—Stoel Rives LLP

(57) ABSTRACT

A method automatically tests a parameter of an electronic component to determine whether the component has an acceptable value. The method employs an automatic electronic component testing machine having at least first and second measurement positions where the parameter can be measured. The testing process itself may falsely cause the value to appear to be unacceptable when the value is actually acceptable. The method places the component in a first measurement position and measures the parameter in the first position, thereby generating a first measured parameter value. The method also places the component in a second measurement position and measures the parameter in the second position, thereby generating a second measured parameter value. The method rejects the component only if all measured values are unacceptable, whereby the probability of falsely rejecting the component is less than if only a single measuring step were performed.

27 Claims, 9 Drawing Sheets

METHOD AND MACHINE FOR REPETITIVE TESTING OF AN ELECTRICAL COMPONENT

RELATED APPLICATION

This application claims priority to U.S. Provisional Patent Application No. 60/630,261, entitled "Method for Repetitive Testing of an Electrical Component," filed Nov. 22, 2004, which is incorporated by reference herein in its entirety. U.S. Provisional Patent Application No. 60/630,253, entitled "Vacuum Ring Designs for Electrical Contacting Improvement," filed Nov. 22, 2004, is also incorporated by reference herein in its entirety.

TECHNICAL FIELD

This disclosure relates generally to electronic component testing and more particularly to testing of capacitors.

BACKGROUND

Capacitors, which store electric charge, are one of the basic building blocks of electronic circuits. In its most basic form, a capacitor comprises two conductive surfaces separated from one another by a small distance, wherein a nonconductive dielectric material lies between the conductive surfaces. The capacitance C of such an arrangement is proportional to KA/d, wherein K is the dielectric constant of the middle material, A is the area of the opposing conducting surfaces, and d is the distance between the conducting surfaces.

FIG. 1 is a side cut-away isometric view of a multilayer capacitor 120. The capacitor 120 has two external connections or electrodes 124 and 128, shown on the left and right, respectively. Connected to the electrode 124 are a number of generally parallel conductive sheets or plates 130. Likewise, connected to the electrode 128 are a number of generally parallel conductive sheets or plates 140. The conductive plates 130 and 140 intermesh as shown. Between the conductive plates 130 and 140 is a dielectric material 150. An optional casing 160 can be used to cover the external faces of the capacitor 120 between the electrodes 124 and 128. The multilayer arrangement results in a multiplicative increase in capacitance proportional to the number of intermeshed plates. In fact, the formula for the capacitance of this arrangement is proportional to nKA/d where n is the number of plates from each electrode.

When the dielectric material 150 is a ceramic, the capacitor 120 is a multilayer ceramic capacitor (MLCC). MLCCs have become popular because ceramic materials are available with a desirably high dielectric constant. Ceramic dielectric materials can also be fabricated in thin layers, resulting in a small interplate spacing d, and thereby increased capacitance. A ceramic dielectric material is typically formed by mixing a ceramic powder with an organic binder, which acts like a slurry. When the ceramic hardens, it holds the electric plates 130 and 140 in place.

FIG. 2A is a schematic diagram of an equivalent circuit model 200 of a capacitor, such as the multilayer capacitor 120. In the model 200, the terminals 210 and 220 represent the electrodes 124 and 128. The equivalent circuit model 200 comprises a capacitance C, a parallel resistance $R_P$, a series resistance $R_S$, and an inductance L. In an ideal capacitor, only the capacitance C would be present. The parallel resistance $R_P$, series resistance $R_S$, and the inductance L arise from unwanted or nonideal effects in a real capacitor. For example, if there is some leakage current flowing through the dielectric material 150, that is modeled by the parallel resistance $R_P$. As another example, if there is some resistance in the electrodes 124 or 128, that is modeled by the series resistance $R_S$. The combined effects of all resistances in a capacitor are jointly modeled as an equivalent series resistance (ESR), as shown in FIG. 2B, which is a simplified equivalent circuit model 250 of a capacitor.

There are many parameters that characterize a capacitor. Chief among them is, of course, capacitance C. Other parameters include ESR and the values of the other elements in the equivalent circuit model 200. Other capacitor parameters that usefully specify its behavior in alternating current (AC) circuits include loss angle, phase angle, power factor, and dissipation factor, all of which are measures of the loss in a capacitor when an AC signal is applied to its electrodes. They are related mathematically as follows:

$$PF=\cos(\Phi)=\sin(\delta)$$

$$DF=\tan(\delta)$$

$$\Phi+\delta=\pi/2$$

where PF is the power factor, DF is the dissipation factor, $\Phi$ is the phase angle, and $\delta$ is the loss angle in phasor notation. Dissipation factor can also be expressed in terms of ESR at a given AC frequency as follows:

$$DF=ESR/X_c$$

where $X_c$ is the reactance of the capacitor at the given frequency.

Capacitor manufacturers typically specify their capacitors in terms of parameters such as capacitance C and dissipation factor DF. Manufacturers typically test their capacitors to ensure that they fall within acceptable limits before they are released for sale. If a capacitor, for example, has an excessively large dissipation factor it is rejected.

Manufacturers typically utilize testing machines to perform industry-standard tests to measure specified capacitor parameters. Such machines can automatically handle capacitors; subject them to specified electrical, mechanical, and/or environmental conditions; measure parameters; make a pass/reject decision on each piece based on the measurement results, and sort the tested capacitors based on the pass/reject decision. Examples of such machines are the model 3300 family of MLCC test stations made by Electro Scientific Industries, Inc. of Portland, Oregon. U.S. Pat. No. 5,842,579, which is incorporated by reference herein, describes one such machine.

A challenge faced by capacitor testing equipment is the challenge to make each measurement reliably, without introducing errors because erroneous pass/reject decisions either decrease yield rates, decrease testing throughput as rejected components are retested, or both.

SUMMARY

According to one embodiment, a method automatically tests a parameter of an electronic component to determine whether the component has an acceptable parameter value. The method employs an automatic electronic component testing machine having at least first and second measurement positions where the parameter of the electronic component can be measured. The testing process itself may falsely cause the parameter value to appear to be unacceptable when the parameter value is actually acceptable. The method places the component in a first measurement position and measures the parameter of the component in the first measurement position, thereby generating a first measured parameter value. The method also places the component in a second measurement position and measures the parameter of the component in the second measurement position, thereby generating a second measured parameter value. The method rejects the component only if all measured parameter values are unacceptable, whereby the overall probability of the method falsely rejecting the component is less than if only a single measuring step were performed.

According to another embodiment, a machine for testing electrical components comprises a testing instrument, a component seat, first and second opposing electrical contacts, and decision logic. The testing instrument has two input connections and measures a parameter of a component connected to its input connections. The component seat provides an electrical contact from one terminal of the component to a first of the two input connections of the testing instrument. The first opposing electrical contact is electrically connected to the second of the input connections of the testing instrument. The second opposing electrical contact is electrically connected to the second of the input connections of the testing instrument. The second opposing electrical contact is offset from the first by some amount. The decision logic is connected to the testing instrument. The seat is relatively movable between the first opposing electrical contact and the second opposing electrical contact. The machine measures the parameter of the component when the first opposing electrical contact overlies the component in the seat, thereby generating a first measured parameter value. The machine also measures the parameter of the component when the second opposing electrical contact overlies the component in the seat, thereby generating a second measured parameter value. The decision logic makes a pass/reject decision for the component, wherein the component receives a reject decision if all of the measured parameter values corresponding to the component are unacceptable.

Details concerning the construction and operation of particular embodiments are set forth in the following sections.

DETAILED DESCRIPTION OF AN EMBODIMENT

With reference to the above-listed drawings, this section describes particular embodiments and their detailed construction and operation. As one skilled in the art will appreciate, certain embodiments may be capable of achieving certain advantages over the known prior art, including some or all of the following: (1) improved reliability of electronic component testing; (2) decreased rejection rates, particularly false rejections, and thereby increased yield; and (3) increased testing throughput. These and other advantages of various embodiments will be apparent upon reading the following.

Figure 3:
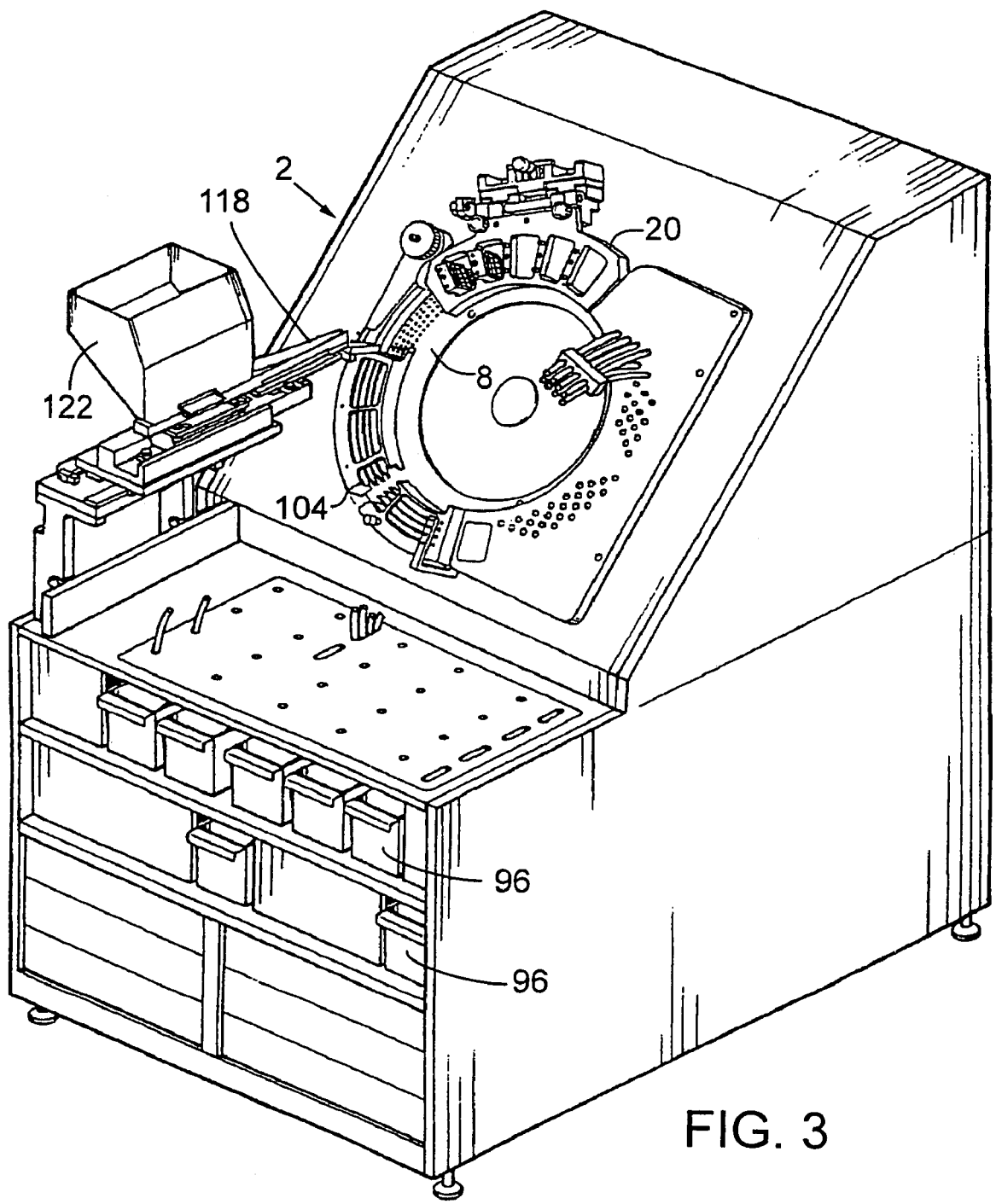
FIGS. 3–9 depict an automatic capacitor testing machine and parts thereof, according to one embodiment.
Figure 4:
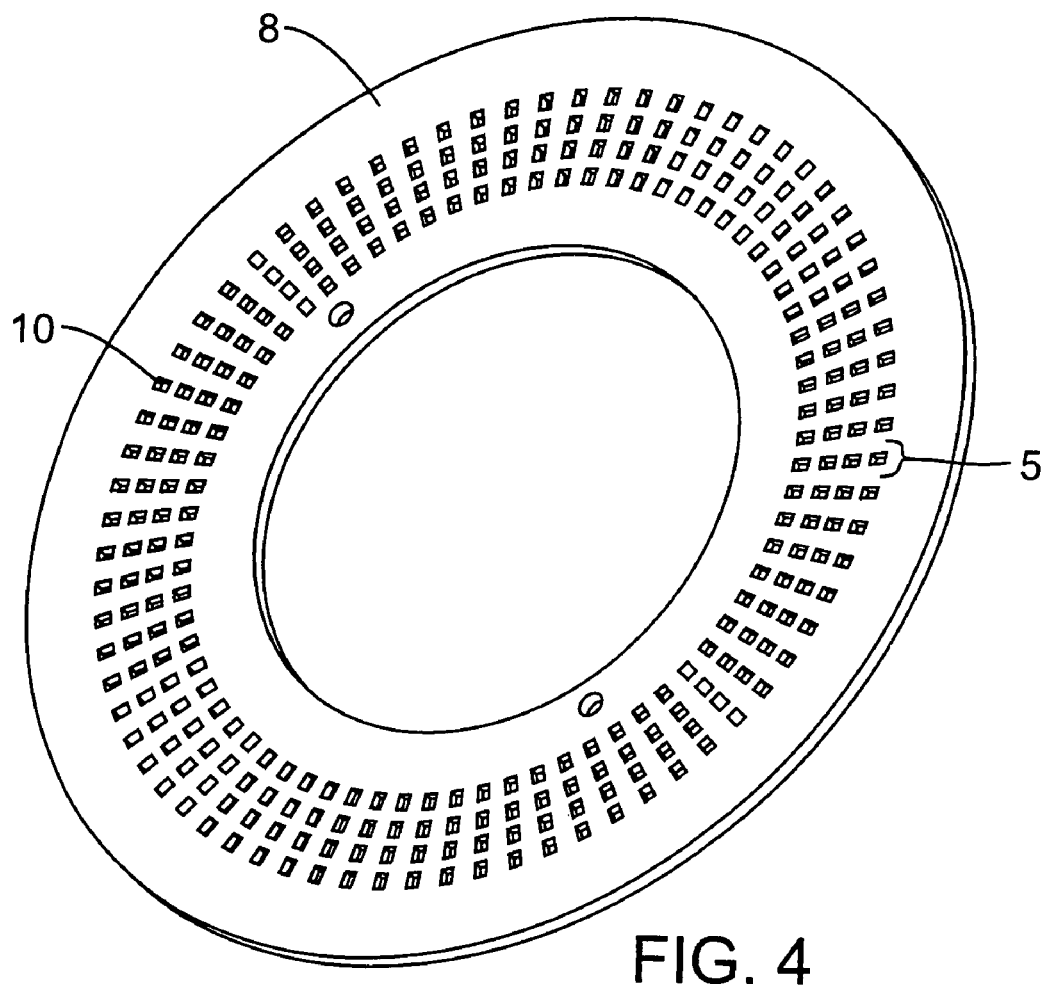
Figure 5:
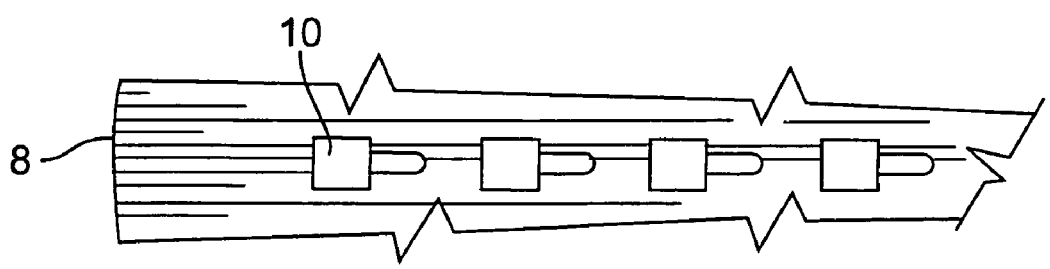
Figure 6:
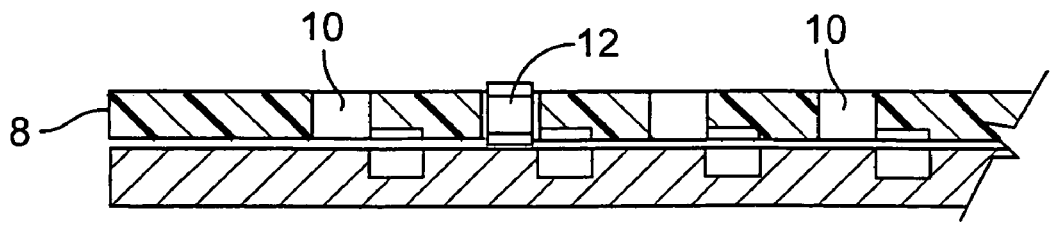
Figure 7:
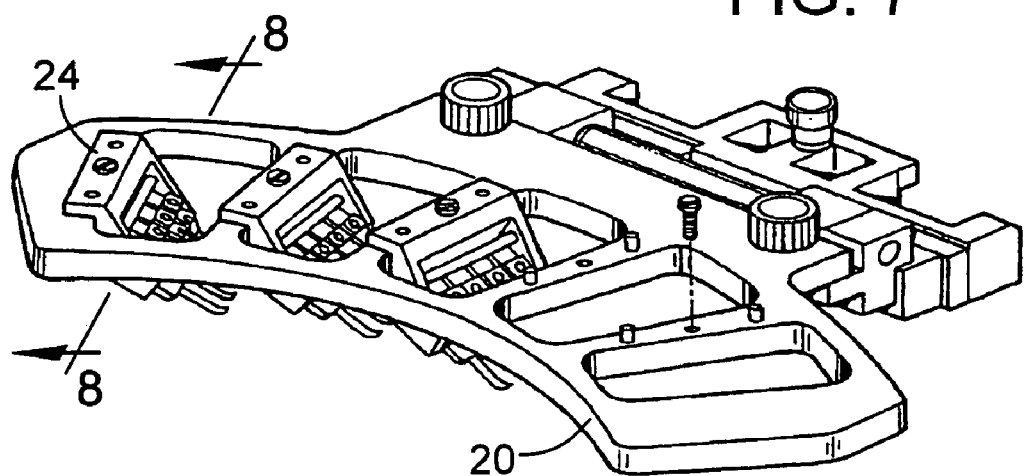
Figure 8:
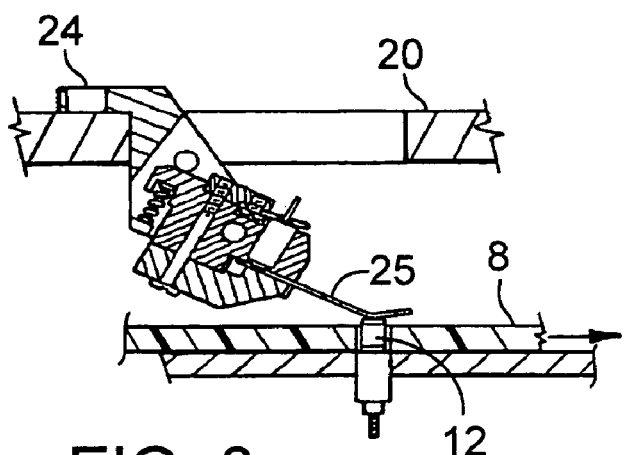
Figure 9:
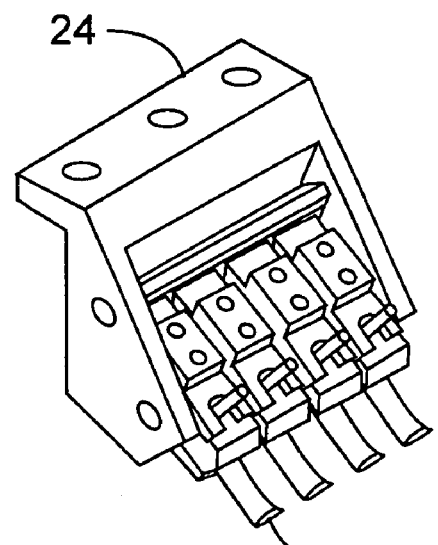

FIGS. 3–9 depict an automatic capacitor testing machine 2 and parts thereof, according to one embodiment. FIG. 3 is an overall pictorial view of the automatic capacitor testing machine 2. FIG. 4 is a pictorial view of a test plate 8, FIG. 5 is a partial view of the underside of the test plate 8, and FIG. 6 is a partial cross-sectional view of the test plate 8. FIG. 7 is a pictorial view of a contactor assembly 20. FIG. 8 is a partial cross-sectional view of a contactor module 24 mounted in the contactor assembly 20, and FIG. 9 is a pictorial view of the contactor module 24.

The automatic component testing machine 2 accepts electrical components 12, tests those components 12 by measuring a number of component parameters and automatically sorts the tested components 12 into at least pass and reject categories. The components 12 may be capacitors, such as the MLCC 120 shown in FIG. 1. The automatic component testing machine 2 is described in full detail in the above referenced U.S. Pat. No. 5,842,579. Included herein is a summary description of the automatic component testing machine 2 and selected parts thereof.

Figure 1:
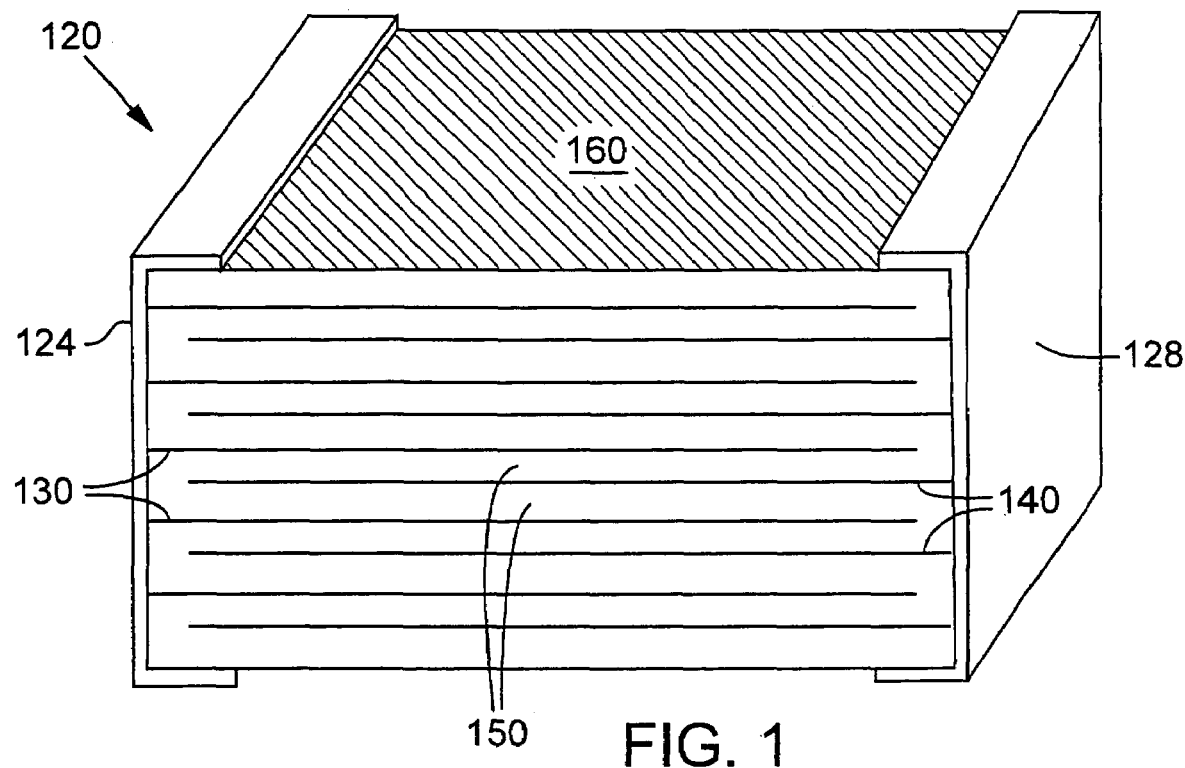
FIG. 1 is a side cut-away isometric view of a multilayer capacitor.
Figure 2A:
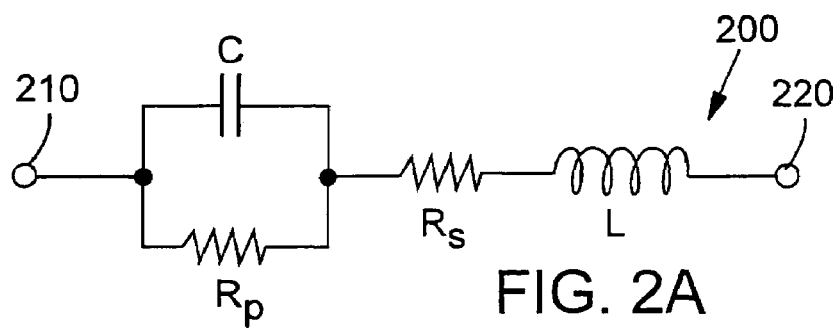
FIGS. 2A and 2B are schematic diagrams of equivalent circuit models of a capacitor.
Figure 2B:
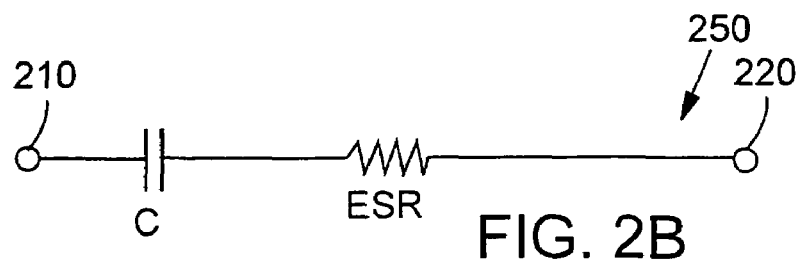

The automatic component testing machine 2 comprises a hopper 122 and a feeder tray 118. As components 12 are deposited into the open mouth of the hopper 122, they are fed automatically in the proper orientation into open component seats 10 in the test plate 8, as the test plate 8 rotates about its axis. The proper orientation for a multilayer capacitor is with either electrode 124 or 128 down (i.e., rotated 90 degrees from what is shown in FIG. 1). The component seats 10 are arranged in N concentric rings. Thus, each radially directed row 5 consists of N component seats 10. When a component 12 is seated in a seat 10, the bottom side of the component connects to an electrical contact, which connects to a testing instrument (not shown). The underside electrical contacts in each seat may be self-cleaning, as described in commonly owned U.S. patent application Ser. No. 10/916,063, entitled "Self-Cleaning Lower Contact," filed Aug. 9, 2004. As the seated components 12 are moved along the rotating test plate 8, they pass under the contactor assembly 20, which contains a number of contactor modules 24. Each contactor module 24 contains a row of N upperside electrical contacts 25, which are also connected to a terminal of the testing instrument.

As the test plate 8 and the contactor assembly 20 rotate relative to one another, the upperside electrical contacts 25 connect to the upwardly oriented terminal of the components 12 in a given row (as shown, for example, in FIG. 8), so that a measurement can be taken by the testing instrument on the components in that row. Each different contactor module 24 in the contactor assembly 20 may measure a different parameter. Alternatively, two or more of the contactor modules 24 in the same contactor assembly 20 may perform repetitive measurements of the same parameter. Additionally, one contactor module 24 may perform multiple measurements on each device as well. In general, a component 12 passes if all of the measured parameters are within an acceptable range; if any one of the measured parameters is outside of its acceptable range, then the component 12 is rejected. Decision logic (not shown) keeps track of the measured parameter values for each measurement and decides whether a given component 12 should be passed or rejected. The automatic component testing machine 2 directs passed components and rejected components to separate bins in bin trays 96.

A number of variations to the machine 2 are possible. For example, rather than arranging the component seats 10 in concentric rows, the rows may be arranged in a straight, rectangular pattern, in which case the contactor module(s)

24 move in a straight rather than circular trajectory over the seats 10. Furthermore, the number of seats in a row, number of rows, number of contactor modules 24, etc. can be varied as desired. Also, motion between the electrical contacts 25 and the component seats 10 need only be relative motion. Either could be still while the other moves, or both could move but differently such that there is relative motion. Accordingly, all reference to motion, movement, vibration, or the like herein means relative motion movement, vibration, or the like between the relevant objects.

The present inventors have discovered that the electrical contacts in the automatic component testing machine 2 can become contaminated and that contamination can adversely affect the measurements. This contamination can be temporary in nature, as the general machine operation tends to periodically clean the contact surfaces. Furthermore, the contamination can be a minute particle of foreign material that can occasionally cause faulty readings. Additionally, the terminal ends of the capacitors can be contaminated or contain localized debris or oxidation. The present inventors have discovered that this problem can be especially troublesome when the components 12 are capacitors, such as MLCCs, as the contamination adds additional series resistance to the capacitor and therefore tends to artificially elevate the dissipation factor. This can result in either a higher rejection rate and, thus, either increased waste in the form of discarded components or decreased testing throughput as an operator must manually assist the testing method by emptying bins of rejected components back into the hopper 122 for re-testing, in hopes that the truly acceptable components will not be retested using the faulty electrical contact, or be contacted on the same specific contaminated spot on the capacitor terminal. Neither alternative is attractive.

This problem can be largely solved, and its disadvantages avoided, by repetitive testing of the components 12 during the regular testing cycle. In one configuration, multiple, rather than a single, contactor modules 24 can be provided to measure the same parameter (e.g., dissipation factor or another AC loss parameter of a capacitor). The decision logic rejects the component 12 only if all of the repetitive measurements yield an unacceptable parameter. Conversely, if only one of the repetitive measurements is acceptable, the part is passed as good. This is particularly effective to avoid the deleterious effects of sporadic electrical contact contamination on the measurement of AC loss parameters in capacitors or localized contamination on the capacitor terminals, as the added resistance created by the contamination always adds to, but cannot detract from, the measured AC loss. In other words, repetitive measurements in that case always improves the reliability of the measurement results and cannot cause passing of a truly bad component 12. Generally, providing N repetitive measurements of the same parameter can decrease the false reject rate (the rate at which truly acceptable components are rejected by the automatic component testing machine 2) by approximately a factor of N. (The false reject rate might normally be 5%, and drop to 2% with redundant measurement.) That can result in significantly improved yield rates and/or throughput.

Figure 10:
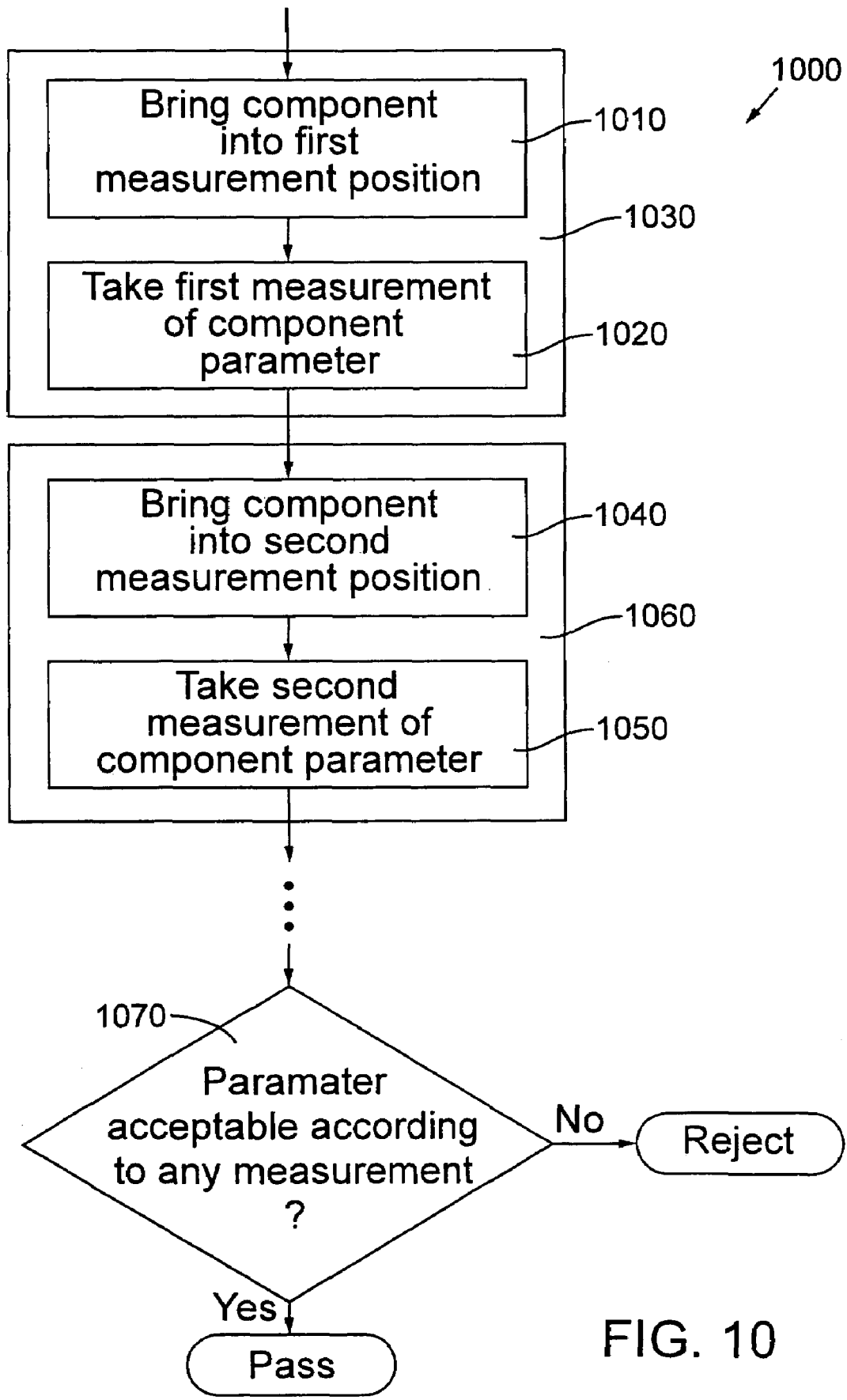

FIG. 10 is a flowchart of a method 1000 according to one embodiment. The method 1000 begins by bringing (1010) a component into a first measurement position and taking (1020) a first measurement of a parameter of the component in the first position. The bringing step 1010 and taking step 1020 can be jointly referred to as step 1030. The method 1000 next brings (1040) the component into a second measurement position and takes (1050) a second measurement of the parameter in the second position. The steps 1040 and 1050 are jointly referred to as the step 1060. The method 1000 can optionally continue repeating that pattern a third, fourth, or any number of times. When all repetitive measurement are taken, the method 1000 determines (1070) whether the component has an acceptable parameter. The method 1000 does this by giving the component a passing grade (with respect to this parameter only) if any of the multiple measurements resulted in an acceptable parameter value. On the other hand, if all of the multiple measurements resulted in unacceptable parameter values, then the component is rejected. The method 1000 works well when there is some statistical independence between each measurement, such as the use of different electrical contacts on at least one terminal of the components, the performance of a cleaning action directed at an electrical contact, or simply the passage of some time.

Another technique to improve the effectiveness of the repetitive measurement is to change the condition of the contact-to-capacitor connection between each repetitive measurement. Methods employing various forms of this technique are next described with reference to FIGS. 11–14, which are flowcharts depicting various method embodiments of the invention. These methods will be described with reference to the machine 2 and parts thereof, as illustrated in FIGS. 3–9, although the methods are capable of use with different machines and a variety of structures.

Figure 11:
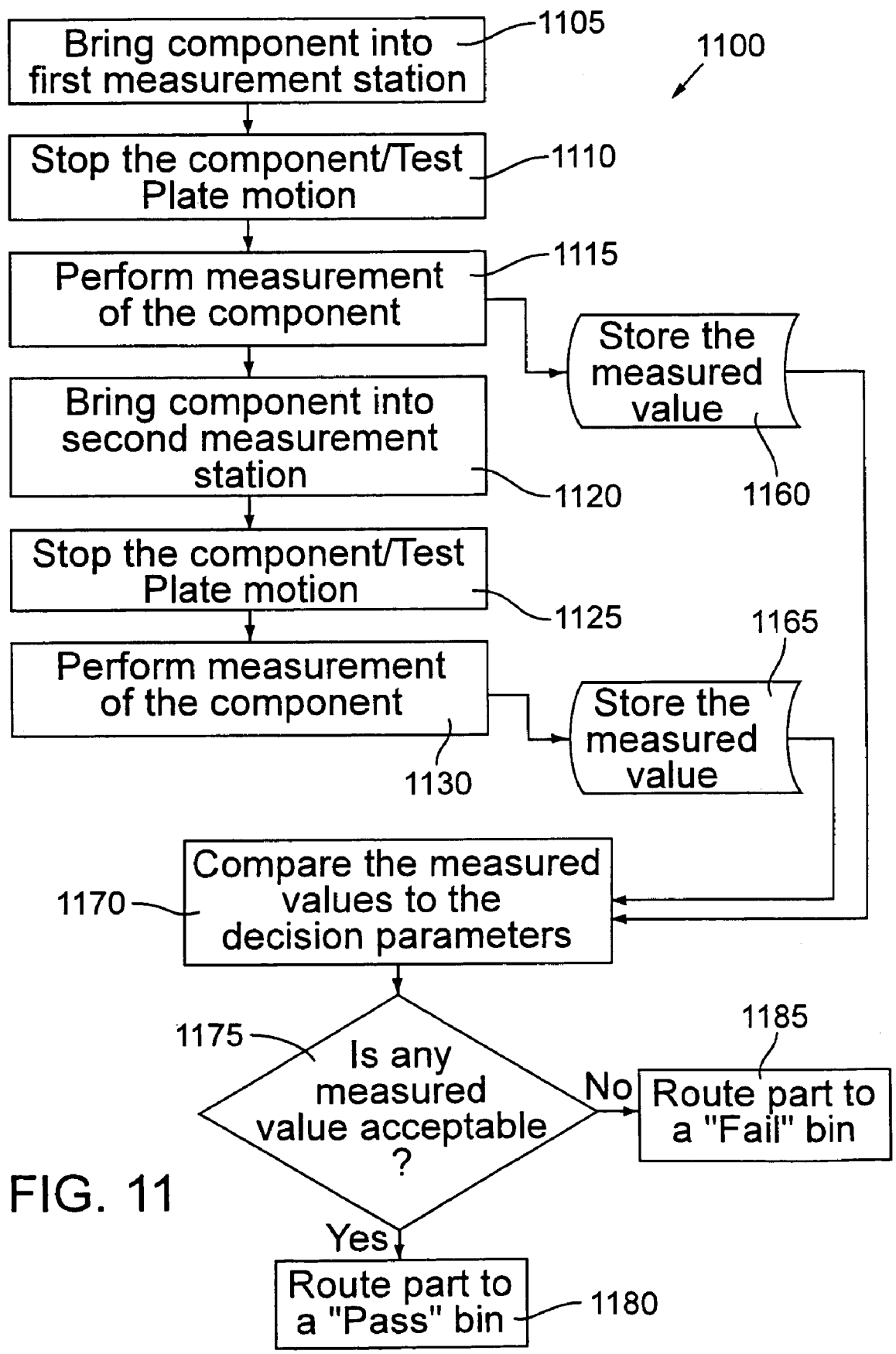
FIGS. 11–14 are flowcharts of methods according to various embodiments.

FIG. 11 is a flowchart of a method 1100. The main flow of steps in the method 1100 is represented by the blocks labeled 1105–1130. The method 1100 entails bringing (1105) a component 12 into a first measurement position, e.g., underneath a first contactor module 24, stopping (1110) the motion of the component 12 relative to the contactor module 24, measuring (1115) the parameter while the component 12 and contactor module 24 are relatively still, bringing (1120) the component 12 into a second measurement position, e.g., underneath a second contactor module 24 or underneath a different contact 25 of the same contactor module 24 (e.g., if the contactor module 24 is capable of motion in the radial direction), stopping (1125) the motion of the component 12 relative to the contactor module 24, and measuring (1130) the parameter while the component 12 and contactor module 24 are relatively still. In other words, the method 1100 takes two still measurements of the parameter at two different positions. The method 1100 stores (1160, 1165) the measured values, compares (1170) them to a decision parameter, and tests (1175) whether any of the measured values are acceptable. If any are acceptable, the method 1100 routes (1180) the component to the "pass" bin; if none are acceptable, the method 1100 routes (1185) the component to the "fail" or "reject" bin.

Figure 12:
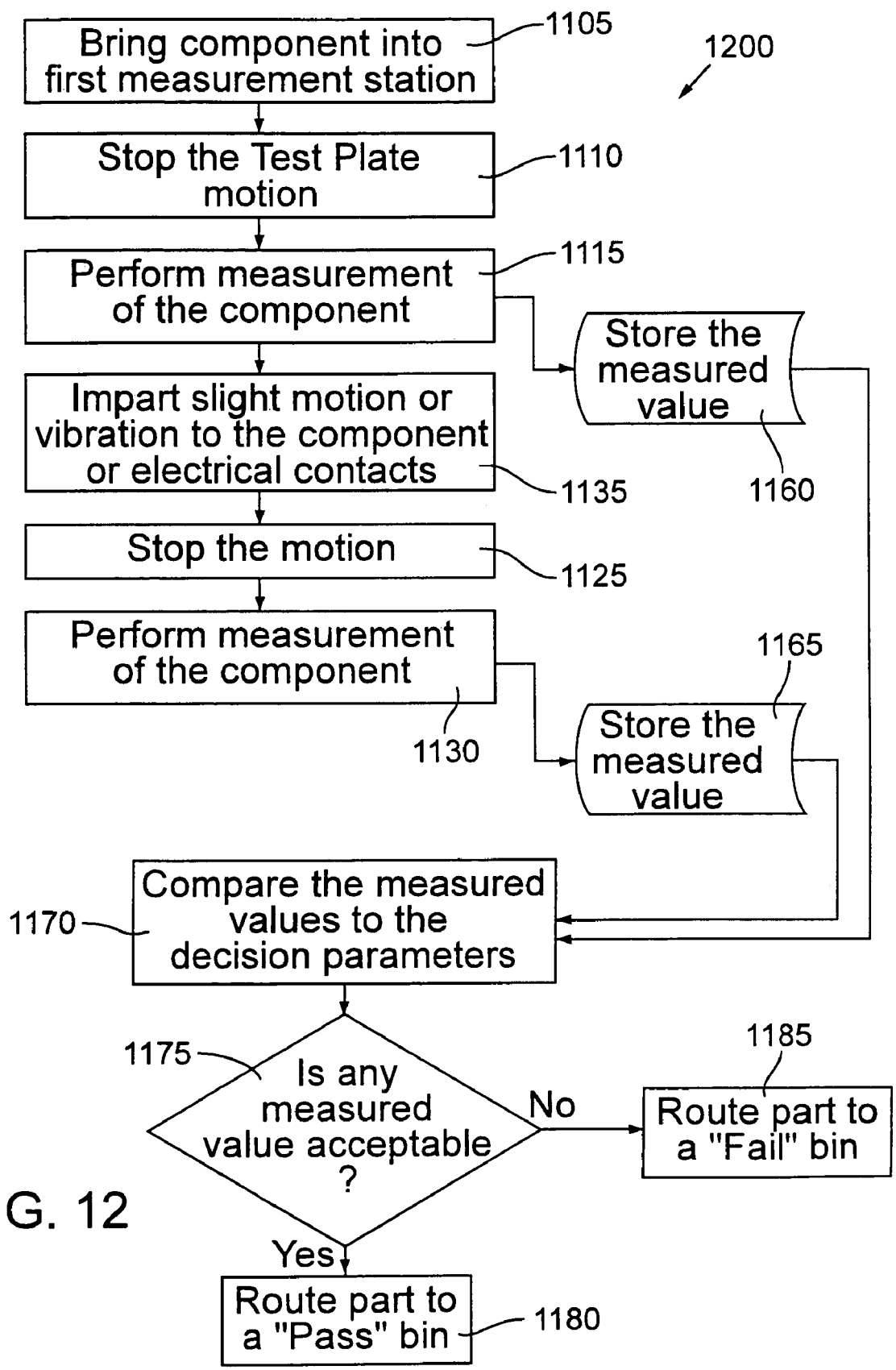

FIG. 12 is a flowchart of a method 1200. Where the steps of the method 1200 are the same as in the method 1100, they are labeled with the same reference number and a description of those steps is not repeated below except where necessary to understand the method 1200. The method 1200 entails bringing (1105) a component 12 into a first measurement position, stopping (1110) the motion of the component 12 relative to the contactor module 24, measuring (1115) the parameter while the component 12 and contactor module 24 are relatively still, vibrating or slightly moving (1135) the component near or about the same nominal measurement position, stopping (1125) that motion of the component 12 relative to the contactor module 24, and measuring (1130) the parameter while the component 12 and contactor module 24 are relatively still. In other words, the method 1200 takes two still measurements of the parameter at roughly the same general positions but introduces a small positional perturbation between the measurements. The vibrating step 1135 can be implemented, for example by subjecting the test plate 10 to a small oscillatory rotational motion. Small or slight in this context means, for example, less than a dimension across an electrode 124 or 128 of the MLCC 120.

Figure 13:
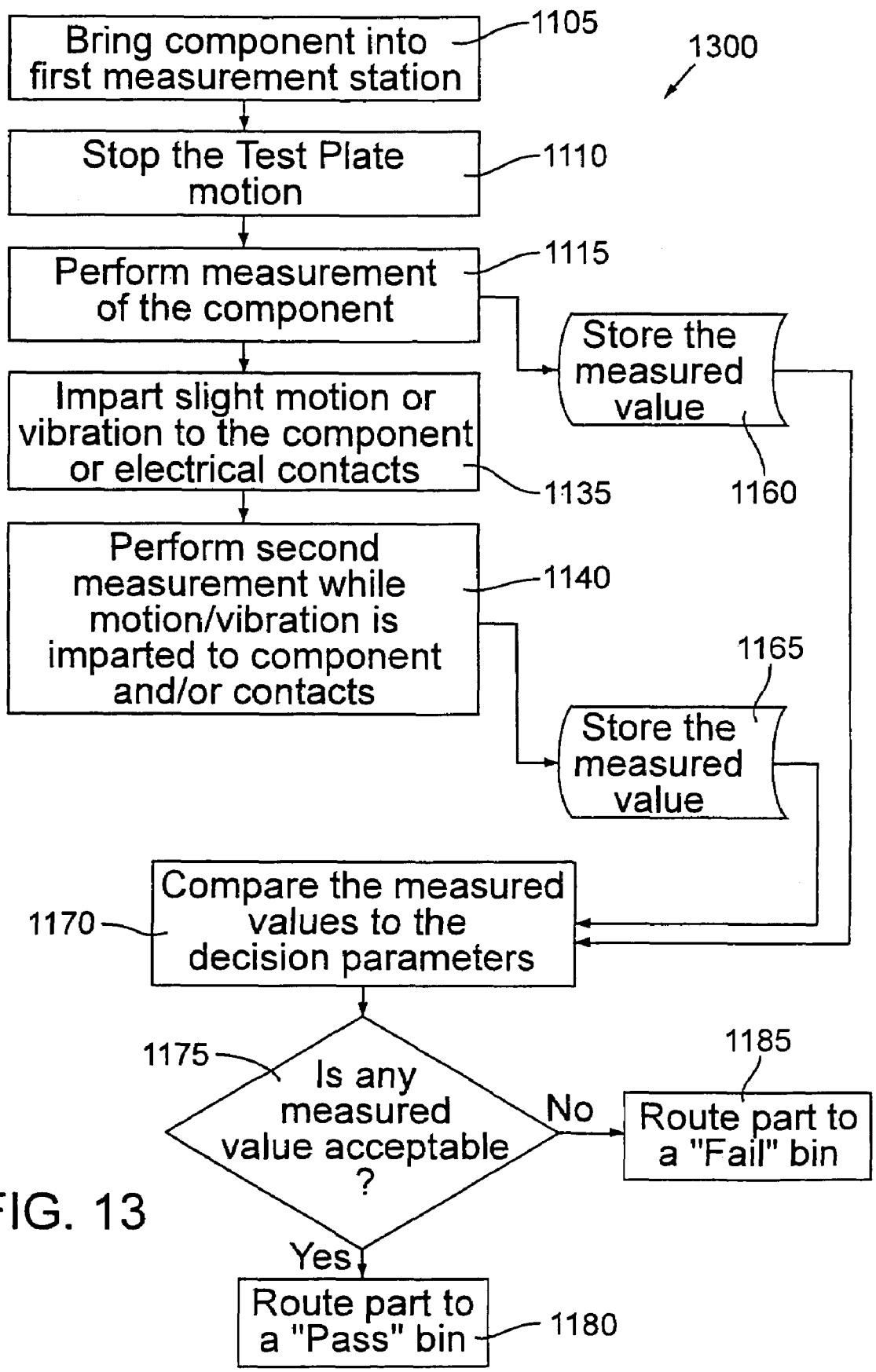

FIG. 13 is a flowchart of a method 1300. Where the steps of the method 1300 are the same as in the method 1100, they are labeled with the same reference number and a description of those steps is not repeated below except where necessary to understand the method 1300. The method 1300 entails bringing (1105) a component 12 into a first measurement position, stopping (1110) the motion of the component 12 relative to the contactor module 24, measuring (1115) the parameter while the component 12 and contactor module 24 are relatively still, initiating a vibration or slight motion (1135) to the component near or about the same nominal measurement position, and measuring (1130) the parameter while the component 12 and contactor module 24 are undergoing that slight relative motion or vibration. In other words, the method 1300 takes one still measurement of the parameter followed by a measurement at the same large-scale position while the component is undergoing some small scale positional perturbation.

Figure 14:
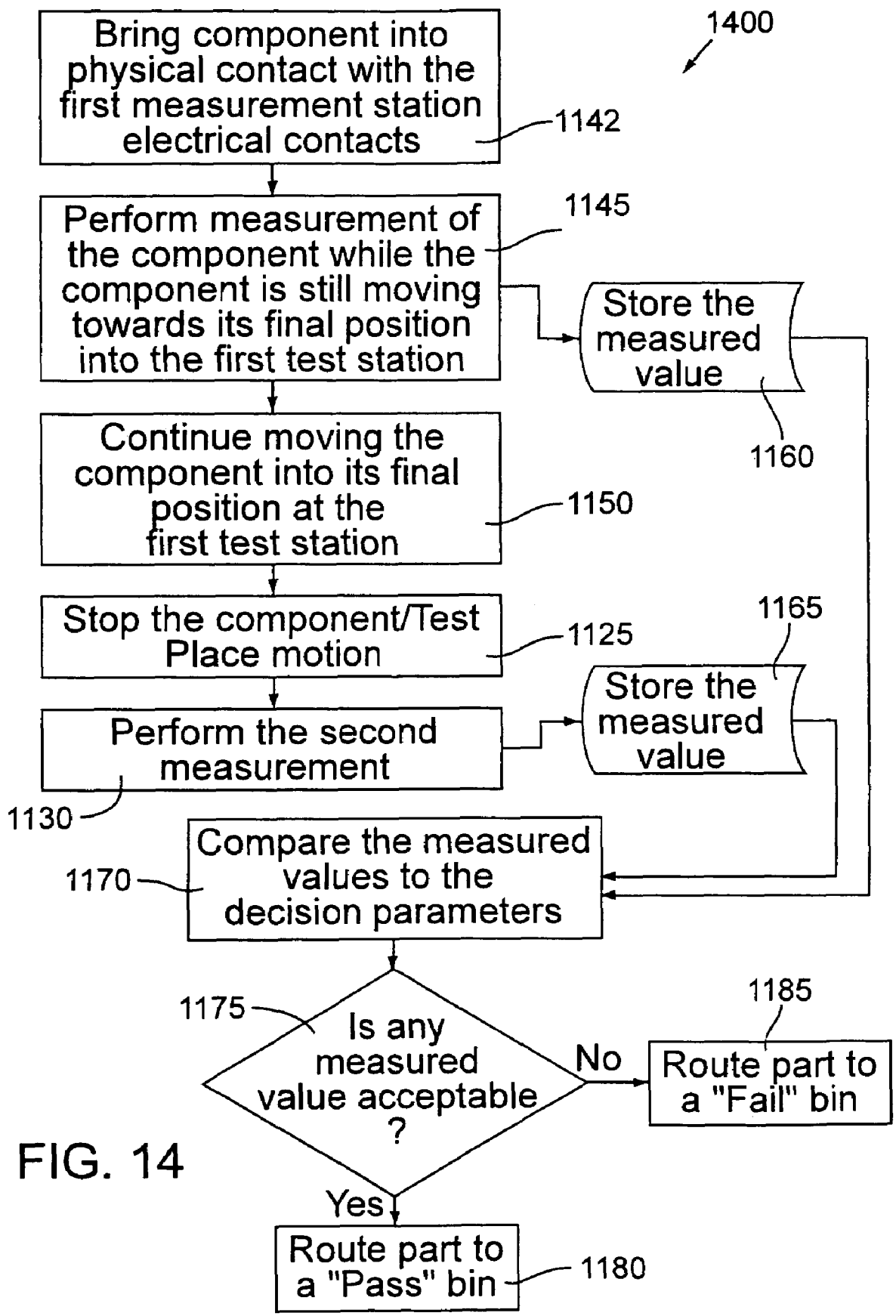

FIG. 14 is a flowchart of a method 1400. Where the steps of the method 1400 are the same as in the method 1100, they are labeled with the same reference number and a description of those steps is not repeated below except where necessary to understand the method 1400. The method 1400 entails bringing (1105) a component 12 into a physical contact with an electrical contact 25, measuring (1145) the parameter while the component 12 and contact 25 are still undergoing relative motion toward a stop position, continuing (1150) the relative motion toward a stop position, stopping (1125) the motion of the component 12 relative to the contact 25, and measuring (1130) the parameter while the component 12 and contactor module 24 when the component 12 and contactor module 24 are relatively still. In other words, the method 1300 takes one slightly premature moving measurement of the parameter followed by a still measurement at the final large-scale position where measurement is intended.

Although FIGS. 11–14 depict just two measurements each, additional measurements can be performed, if desired. The choice of how many repetitive measurements to take is a trade-off between throughput and the false reject rate. Additional repetitions decrease both throughput and the false reject rate.

The various techniques illustrated in FIGS. 11–14 can be practiced together. For example, a hybrid of methods 1300 and 1400 could entail a slightly premature moving measurement, a still measurement at the desired measurement position, followed by a third measurement while the component 12 is undergoing positional perturbations near or about the desired measurement position. Those skilled in the art will recognize the many other combinations suggested by FIGS. 11–14.

The methods 1000–1400 and the decision logic described herein can exist in a variety of forms both active and inactive. For example, they can exist as one or more software programs comprised of program instructions in source code, object code, executable code or other formats. Any of the above can be embodied on a computer-readable medium, which include storage devices and signals, in compressed or uncompressed form. Exemplary computer-readable storage devices include conventional computer system RAM (random access memory), ROM (read only memory), EPROM (erasable, programmable ROM), EEPROM (electrically erasable, programmable ROM), flash memory and magnetic or optical disks or tapes. Exemplary computer-readable signals, whether modulated using a carrier or not, are signals that a computer system hosting or running a computer program can be configured to access, including signals downloaded through the Internet or other networks. Concrete examples of the foregoing include distribution of software on a CD ROM or via Internet download. In a sense, the Internet itself, as an abstract entity, is a computer-readable medium. The same is true of computer networks in general.

The terms and descriptions used herein are set forth by way of illustration only and are not meant as limitations. Those skilled in the art will recognize that many variations can be made to the details of the above-described embodiments without departing from the underlying principles of the invention. The scope of the invention should therefore be determined only by the following claims (and their equivalents) in which all terms are to be understood in their broadest reasonable sense unless otherwise indicated.

The invention claimed is:

1. A method for automatically testing a parameter of an electronic component to determine whether the component has an acceptable parameter value, employing an automatic electronic component testing machine having at least first and second measurement positions where the parameter of the electronic component can be measured, wherein the testing process itself may falsely cause the parameter value to appear to be unacceptable when the parameter value is actually acceptable, the method comprising:

placing the component in the first measurement position;

measuring the parameter of the component in the first measurement position, thereby generating a first measured parameter value;

placing the component in the second measurement position;

measuring the parameter of the component in the second measurement position, thereby generating a second measured parameter value; and rejecting the component, and consequently moving the component to a predetermined area, only if all measured parameter values are unacceptable, whereby the overall probability of the method falsely rejecting the component is less than if only a single measuring step were performed.

2. The method of claim 1, wherein the component is a capacitor.

3. The method of claim 2, wherein the capacitor is an MLCC.

4. The method of claim 2, wherein the parameter is an AC loss parameter.

5. The method of claim 4, wherein the AC loss parameter is dissipation factor.

6. The method of claim 1, wherein the probability that a given single measuring may falsely indicate that the component is unacceptable is attributable to an additional resistance introduced by the measuring step.

7. The method of claim 1, further comprising:

repeating the placing and measuring steps so that those step are performed a grand total of N times, wherein $N \geq 3$.

8. The method of claim 1, wherein the placing steps comprise:

positioning the component between two electrical contacts.

sensing an electrical quantity via the electrical contacts, wherein the electrical quantity is related to the measured parameter; and deriving the measured parameter value from the sensed electrical quantity.

9. The method of claim 8, wherein at least one of the electrical contacts used during the first placing step differs from at least one of the electrical contacts used during the second placing step.

10. The method of claim 8, wherein at least one of the electrical contacts used during the first placing step differs from at least one of the electrical contacts used during the second placing step, and wherein the method further comprises:

cleaning one or more of the electrical contacts between the first and the second measuring steps.

11. The method of claim 8, wherein contamination on one or both of the two electrical contacts can cause a measuring step to falsely cause the measured parameter value to appear to be unacceptable when the parameter value is actually acceptable.

12. The method of claim 1, wherein the first and second measurement positions are offset from each other slightly.

13. The method of claim 12, wherein the first and second measurement positions are approximately the same and the method further comprises:

vibrating the component slightly between the measuring steps.

14. The method of claim 12, wherein the first and second measurement positions are approximately the same and the method further comprises:

vibrating the component slightly between the measuring steps during the step of measuring the parameter of the component in the second measurement position, thereby generating a second measured parameter value.

15. The method of claim 12, wherein the step of measuring the parameter of the component in the first measurement position, thereby generating a first measured parameter value, occurs while the component is in motion toward the second measurement position, and the step of measuring the parameter of the component in the second measurement position, thereby generating a second measured parameter value, occurs while the component is still.

16. A computer readable medium on which is embedded a program performing the method of claim 1, wherein said computer readable medium comprises a storage device, and wherein said computer readable medium is associated with a computer controlling a mechanism that places the component.

17. An automatic electronic component testing machine having at least first and second measurement positions where the parameter of a electronic component can be measured, wherein the testing process itself may falsely cause the parameter value to appear to be unacceptable when the parameter value is actually acceptable, the machine comprising:

a means for placing the component in the first measurement position;

a means for measuring the parameter of the component in the first measurement position, thereby generating a first measured parameter value;

a means for placing the component in the second measurement position;

a means for measuring the parameter of the component in the second measurement position, thereby generating a second measured parameter value;

a means for rejecting the component only if all measured parameter values are unacceptable, whereby the overall probability of the method falsely rejecting the component is less than if only a single measuring step were performed.

18. A machine for testing electrical components, the machine comprising:

a testing instrument having at least two input connections, the testing instrument measuring a parameter of a component connected to at least two of said at least two input connections;

a component seat that provides an electrical contact from one terminal of the component to a first of the at the two input connections of the testing instrument;

a first opposing electrical contact that is electrically connected to a second of the at least two input connections of the testing instrument;

a second opposing electrical contact that is electrically connected to the second of the at least two input connections of the testing instrument, the second opposing electrical contact being offset from the first opposing electrical contact by some amount; and decision logic connected to the testing instrument;

wherein the seat is movable between the first opposing electrical contact and the second opposing electrical contact;

wherein the machine measures the parameter of the component when the first opposing electrical contact overlies the component in the seat, thereby generating a first measured parameter value;

wherein the machine measures the parameter of the component when the second opposing electrical contact overlies the component in the seat, thereby generating a second measured parameter value;

wherein the decision logic makes a pass/reject decision for the component, wherein the component receives a reject decision only if all of the measured parameter values corresponding to the component are unacceptable.

19. A machine as set forth in claim 18, further comprising:

a mechanism that receives a stream of components and serially seats at least a subset of the components in the stream in the component seat.

20. A machine as set forth in claim 18, further comprising:

a plurality of bins, and a mechanism connected to the seat that ejects the component from the seat and directs the component into a selected one of the plurality of bins on the basis of the pass/reject decision.

21. A machine as set forth in claim 18, wherein the component is a capacitor.

22. A machine as set forth in claim 21, wherein the capacitor is an MLCC.

23. A machine as set forth in claim 18, wherein the parameter is an AC loss parameter.

24. A machine as set forth in claim 23, wherein the AC loss parameter is dissipation factor.

25. A machine as set forth in claim 18, wherein one or more of the opposing electrical contacts can become contaminated and thereby cause a falsely unacceptable measured parameter value.

26. A machine as set forth in claim 18, wherein, the component seat is one of a row of component seats, said row extending in a row direction; wherein said first opposing electrical contact is one of a first set of N opposing electrical contacts arranged in a row; wherein said second opposing electrical contact is one of second set of N opposing electrical contacts arranged in a row, wherein the row of component seats is movable relative to the first set of N opposing electrical contacts and the second set of N opposing electrical contacts; wherein the machine measures the parameter of the components in the row when the first set of N opposing electrical contacts overlay the components in the seats, thereby generating a first set of N measured parameter values; wherein the machine measures the parameter of the components in the row when the second set of N opposing electrical contacts overlay the components in the seats, thereby generating a second set of N measured parameter values; and wherein the decision logic makes a pass/reject decision for each component in the row, wherein a particular component receives a reject decision if all of the measured parameter values corresponding to the particular component are unacceptable.

27. A machine as set forth in claim 26, wherein, the component seats are arranged in a plurality of concentric rings, the row of component seats is a set of radially aligned components seats; and the row of component seats move rotatably relative to the first and second sets of N opposing electrical contacts.

* * * * *

UNITED STATES PATENT AND TRADEMARK OFFICE
CERTIFICATE OF CORRECTION

PATENT NO. : 7,173,432 B2
APPLICATION NO. : 11/284789
DATED : November 21, 2005
INVENTOR(S) : Douglas John Garcia, Kyung Young Kim and Locke Lowman It is certified that error appears in the above-identified patent and that said Letters Patent is hereby corrected as shown below:

In Item (56) of the bibliographic page, after "Stubblefield et al.", please insert -- 6,383,825    * 5/2002    Farnworth et al
   5,510,719    * 5/1996    Yamamoto
   5,936,409    * 8/1999    Nishioka
   6,198,290 B1 * 3/2001    Krinker
   6,988,061 B2 * 1/2006    Gray et al.
   7,027,946 B2 * 4/2006    Williams et al.

OTHER PUBLICATIONS

"The Capacitor," general information. No publication data.

ESI 3340 Enhanced Productivity MLCC Multi-Function Tester, October 2003.

ESI Passive Components, http://www.esi.com/products/pd_ecs.asp, viewed 11/20/2004.

"Improve Your Designs with Large Capacitance Value Multi-Layer Ceramic Chip (MLCC) Capacitors", Panasonic Industrial Company, July 3, 2003.

"QuadTech" Application Notes, QuadTech Incorporated, February 2002.

* cited by examiner --

In Column 3, Line 15, change "has two" to --has at least two--.

In Column 3, Line 19, change "the two input connections" to --the input connections--.

In Column 3, Line 52, change "FIGS. 11-14" to --FIGS. 10-14--.

In Column 7, Line 18, change "1130" to --1140--.

In Column 7, Line 30, change "1105" to --1142--.

UNITED STATES PATENT AND TRADEMARK OFFICE
CERTIFICATE OF CORRECTION

| | |
|---|---|
| PATENT NO. | : 7,173,432 B2 |
| APPLICATION NO. | : 11/284789 |
| DATED | : November 21, 2005 |
| INVENTOR(S) | : Douglas John Garcia, Kyung Young Kim and Locke Lowman |

It is certified that error appears in the above-identified patent and that said Letters Patent is hereby corrected as shown below:

In Column 10, Line 13, Claim 18, change "first of the at the two" to --first of the at least two--.

Signed and Sealed this

Sixth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 7,173,432 B2
APPLICATION NO. : 11/284789
DATED : February 6, 2007
INVENTOR(S) : Douglas John Garcia, Kyung Young Kim and Locke Lowman It is certified that error appears in the above-identified patent and that said Letters Patent is hereby corrected as shown below:

In Item (56) of the bibliographic page, after "Stubblefield et al.", please insert -- 
| | | | |
|---|---|---|---|
| 6,383,825 | * | 5/2002 | Farnworth et al |
| 5,510,719 | * | 5/1996 | Yamamoto |
| 5,936,409 | * | 8/1999 | Nishioka |
| 6,198,290 B1 | * | 3/2001 | Krinker |
| 6,988,061 B2 | * | 1/2006 | Gray et al. |
| 7,027,946 B2 | * | 4/2006 | Williams et al. |

OTHER PUBLICATIONS

"The Capacitor," general information. No publication data.

ESI 3340 Enhanced Productivity MLCC Multi-Function Tester, October 2003.

ESI Passive Components, http://www.esi.com/products/pd_ecs.asp, viewed 11/20/2004.

"Improve Your Designs with Large Capacitance Value Multi-Layer Ceramic Chip (MLCC) Capacitors", Panasonic Industrial Company, July 3, 2003.

"QuadTech" Application Notes, QuadTech Incorporated, February 2002.

* cited by examiner --

In Column 3, Line 15, change "has two" to --has at least two--.

In Column 3, Line 19, change "the two input connections" to --the input connections--.

In Column 3, Line 52, change "FIGS. 11-14" to --FIGS. 10-14--.

In Column 7, Line 18, change "1130" to --1140--.

In Column 7, Line 30, change "1105" to --1142--.

UNITED STATES PATENT AND TRADEMARK OFFICE
CERTIFICATE OF CORRECTION

PATENT NO.         : 7,173,432 B2
APPLICATION NO.    : 11/284789
DATED              : February 6, 2007
INVENTOR(S)        : Douglas John Garcia, Kyung Young Kim and Locke Lowman It is certified that error appears in the above-identified patent and that said Letters Patent is hereby corrected as shown below:

In Column 10, Line 13, Claim 18, change "first of the at the two" to --first of the at least two--.

This certificate supersedes Certificate of Correction issued November 6, 2007.

Signed and Sealed this

Fourth Day of December, 2007

JON W. DUDAS
*Director of the United States Patent and Trademark Office*